United States Patent
Sirinorakul et al.

(10) Patent No.: US 7,153,724 B1
(45) Date of Patent: Dec. 26, 2006

(54) METHOD OF FABRICATING NO-LEAD PACKAGE FOR SEMICONDUCTOR DIE WITH HALF-ETCHED LEADFRAME

(75) Inventors: Saravuth Sirinorakul, Bangkok (TH); Somchai Nondhasitthichai, Bangkok (TH); Sitta Jewjaitham, Bangkok (TH); Yee Heong Chua, Singapore (SG)

(73) Assignee: NS Electronics Bangkok (1993) Ltd., Bangkok (TH)

( * ) Notice: Subject to any disclaimer, the term of this patent is extended or adjusted under 35 U.S.C. 154(b) by 0 days.

(21) Appl. No.: 10/637,965

(22) Filed: Aug. 8, 2003

(51) Int. Cl.
*H01L 23/495* (2006.01)
*H01L 21/60* (2006.01)

(52) U.S. Cl. ............... 438/112; 438/462; 257/E23.061
(58) Field of Classification Search ............. 438/106, 438/110–113, 123, 460, 462; 257/667, 787, 257/E23.061
See application file for complete search history.

(56) References Cited

U.S. PATENT DOCUMENTS

| | | | |
|---|---|---|---|
| 6,399,415 B1 * | 6/2002 | Bayan et al. ............... 438/106 |
| 6,452,255 B1 | 9/2002 | Bayan et al. ............... 257/666 |
| 6,483,180 B1 | 11/2002 | Bayan et al. ............... 257/684 |
| 6,489,218 B1 * | 12/2002 | Kim et al. ................... 438/460 |
| 6,501,158 B1 * | 12/2002 | Fazelpour et al. .......... 257/670 |
| 6,646,339 B1 * | 11/2003 | Ku et al. .................... 257/708 |
| 6,667,073 B1 * | 12/2003 | Lau et al. ................... 427/96.2 |
| 6,713,849 B1 * | 3/2004 | Hasebe et al. ............. 257/667 |
| 6,734,536 B1 * | 5/2004 | Kobayakawa ............... 257/676 |
| 6,743,696 B1 * | 6/2004 | Jeung et al. ................ 438/458 |
| 6,812,552 B1 * | 11/2004 | Islam et al. ................. 257/666 |
| 2001/0042904 A1 * | 11/2001 | Ikenaga et al. ............. 257/666 |
| 2002/0149090 A1 * | 10/2002 | Ikenaga et al. ............. 257/666 |
| 2003/0073265 A1 * | 4/2003 | Hu et al. .................... 438/123 |

* cited by examiner

*Primary Examiner*—Carl Whitehead, Jr.
*Assistant Examiner*—Jennifer M. Dolan
(74) *Attorney, Agent, or Firm*—Silicon Valley Patent Group LLP

(57) ABSTRACT

A series of grooves are etched in a leadframe to be used in fabricating a group of semiconductor packages at locations where the leadframe will later be sawed to separate the semiconductor packages. In variations of the process, the grooves may be wider or narrower than the kerf of the saw cuts and may be formed on the side of the leadframe facing towards or away from the entry of the saw blade.

10 Claims, 14 Drawing Sheets

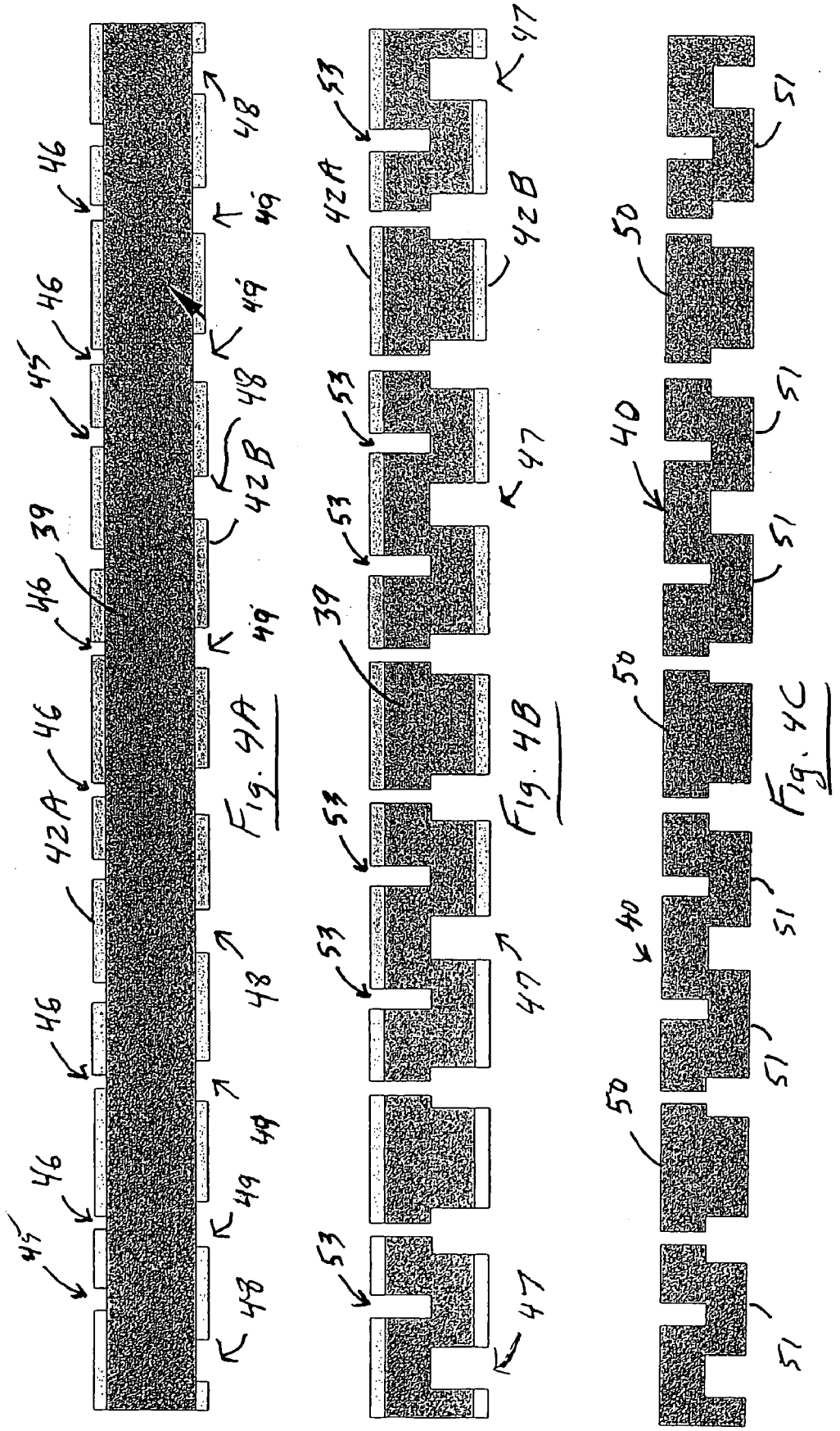

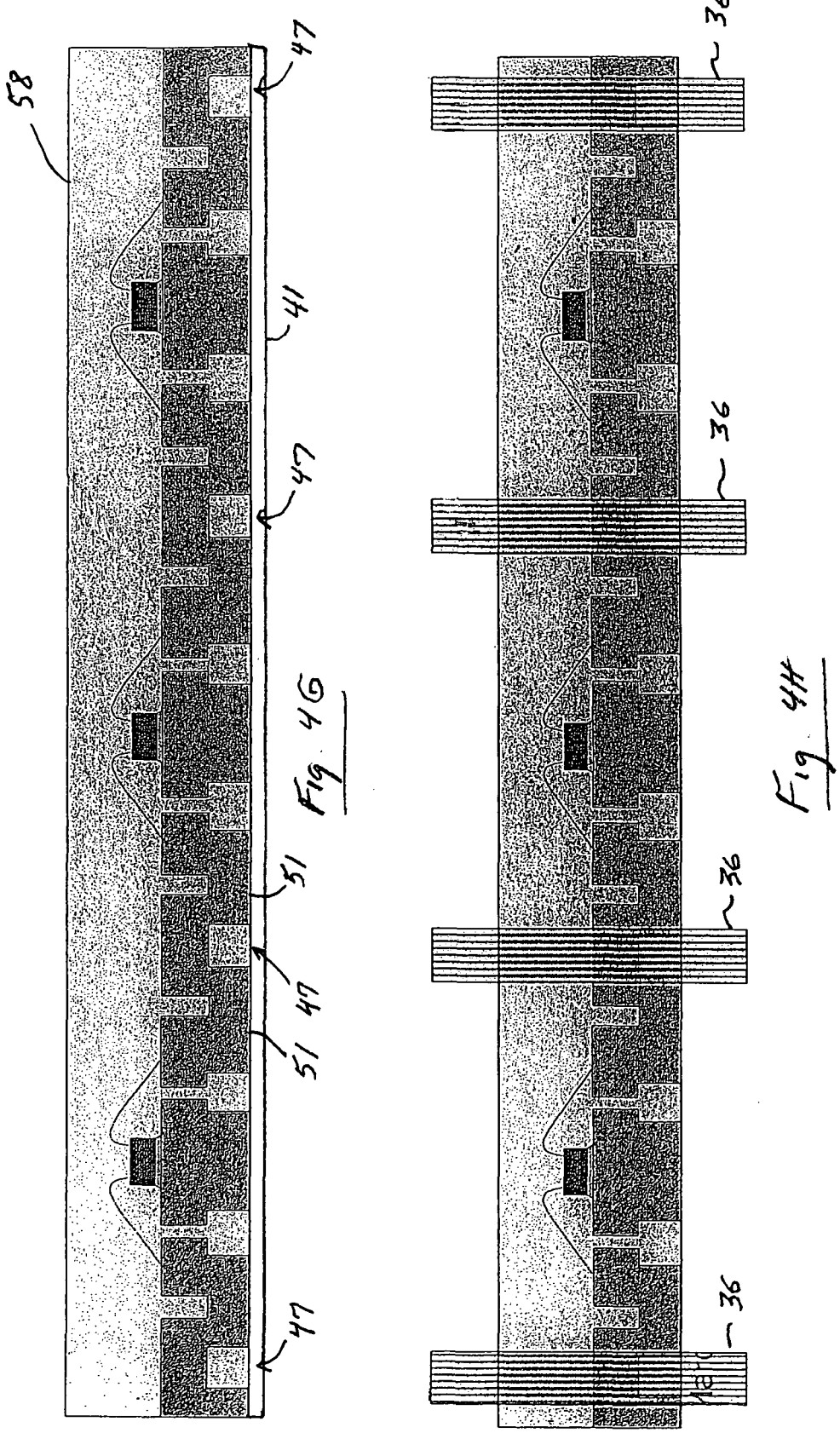

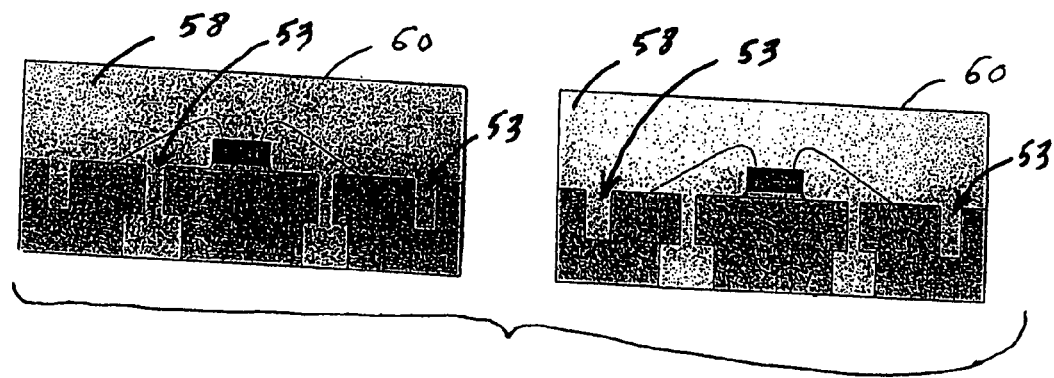
Fig. 5
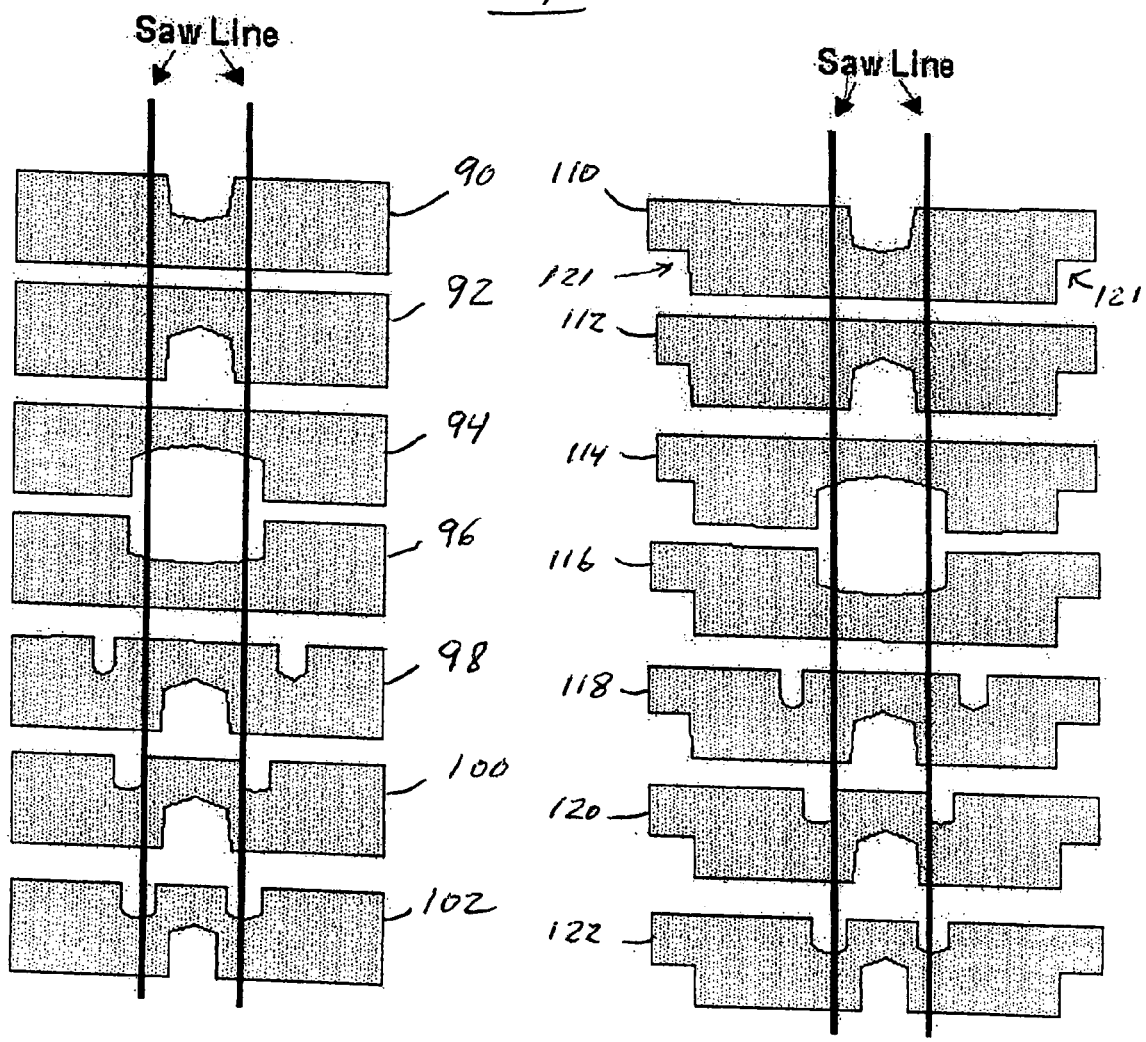
Fig. 6
Fig. 7

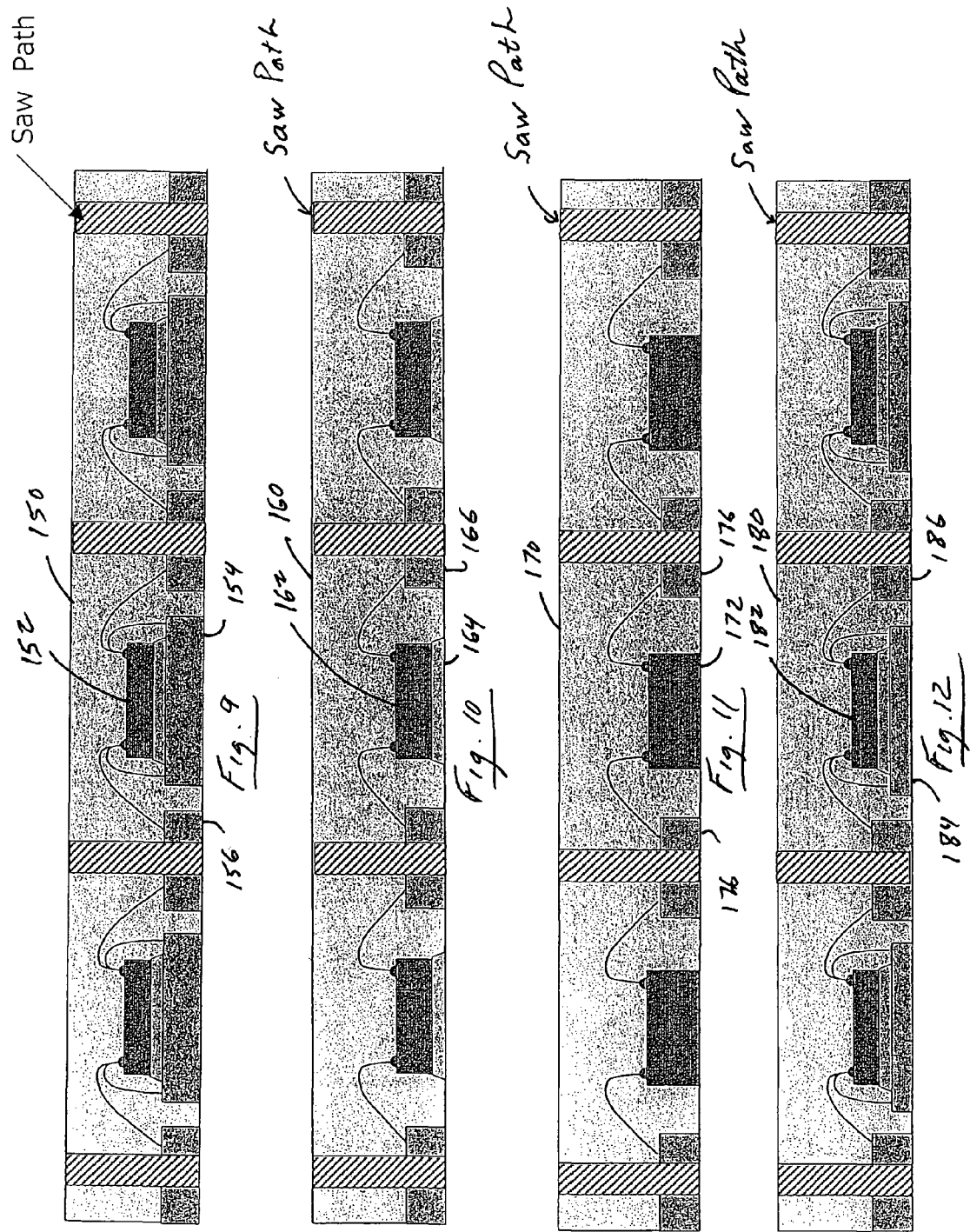

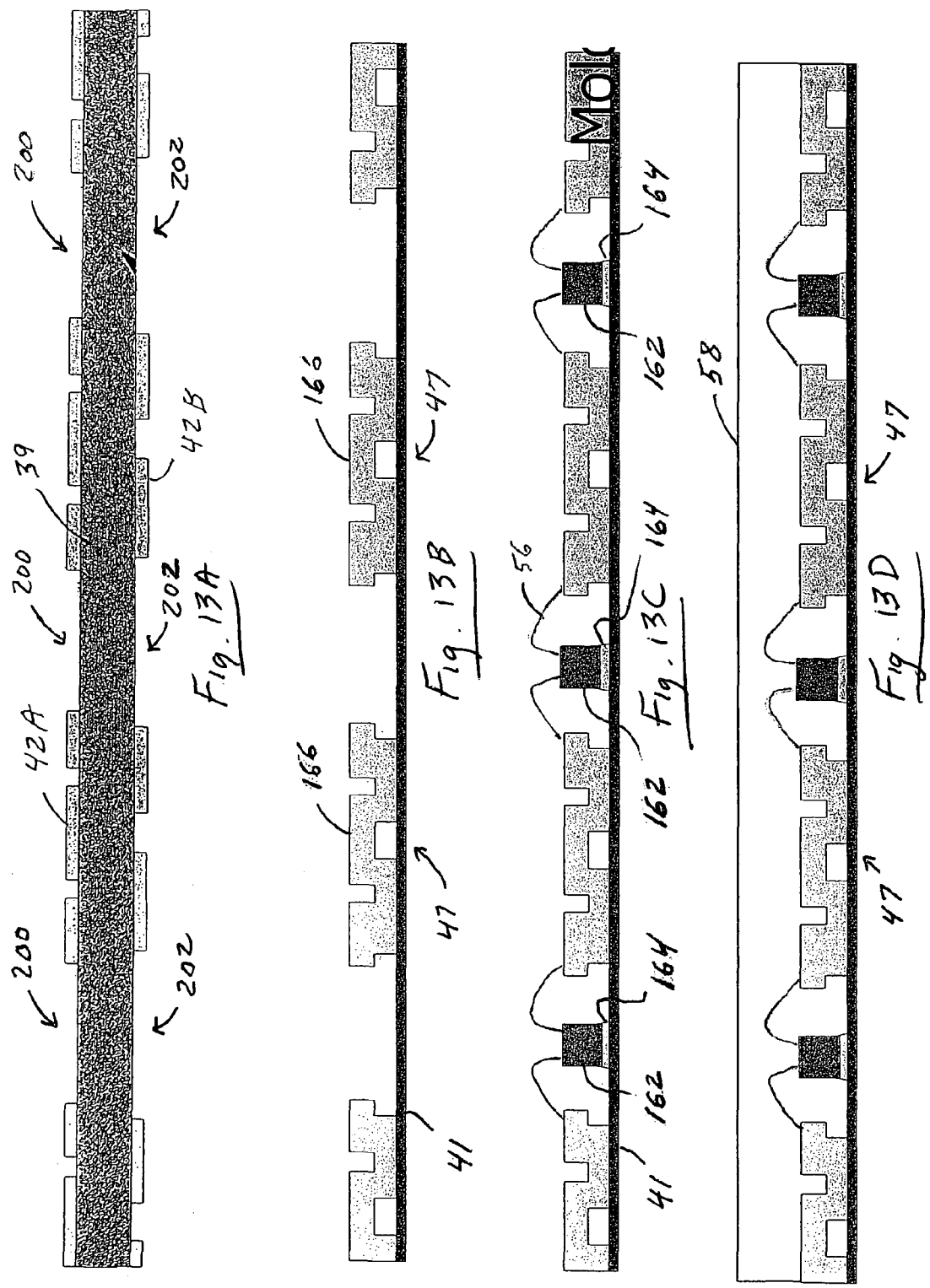

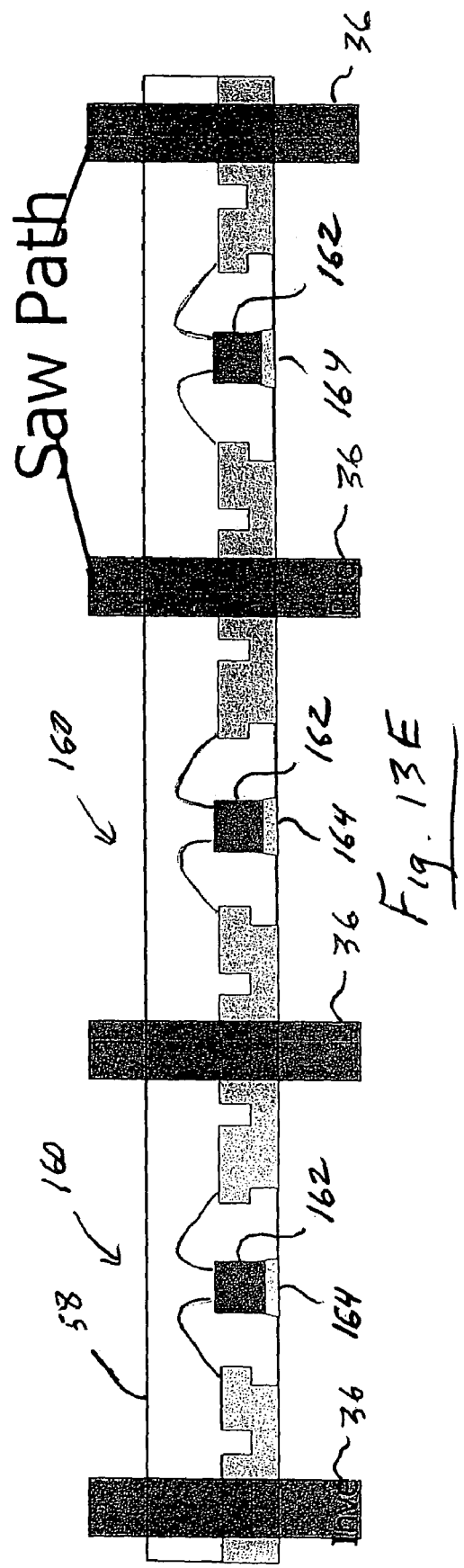

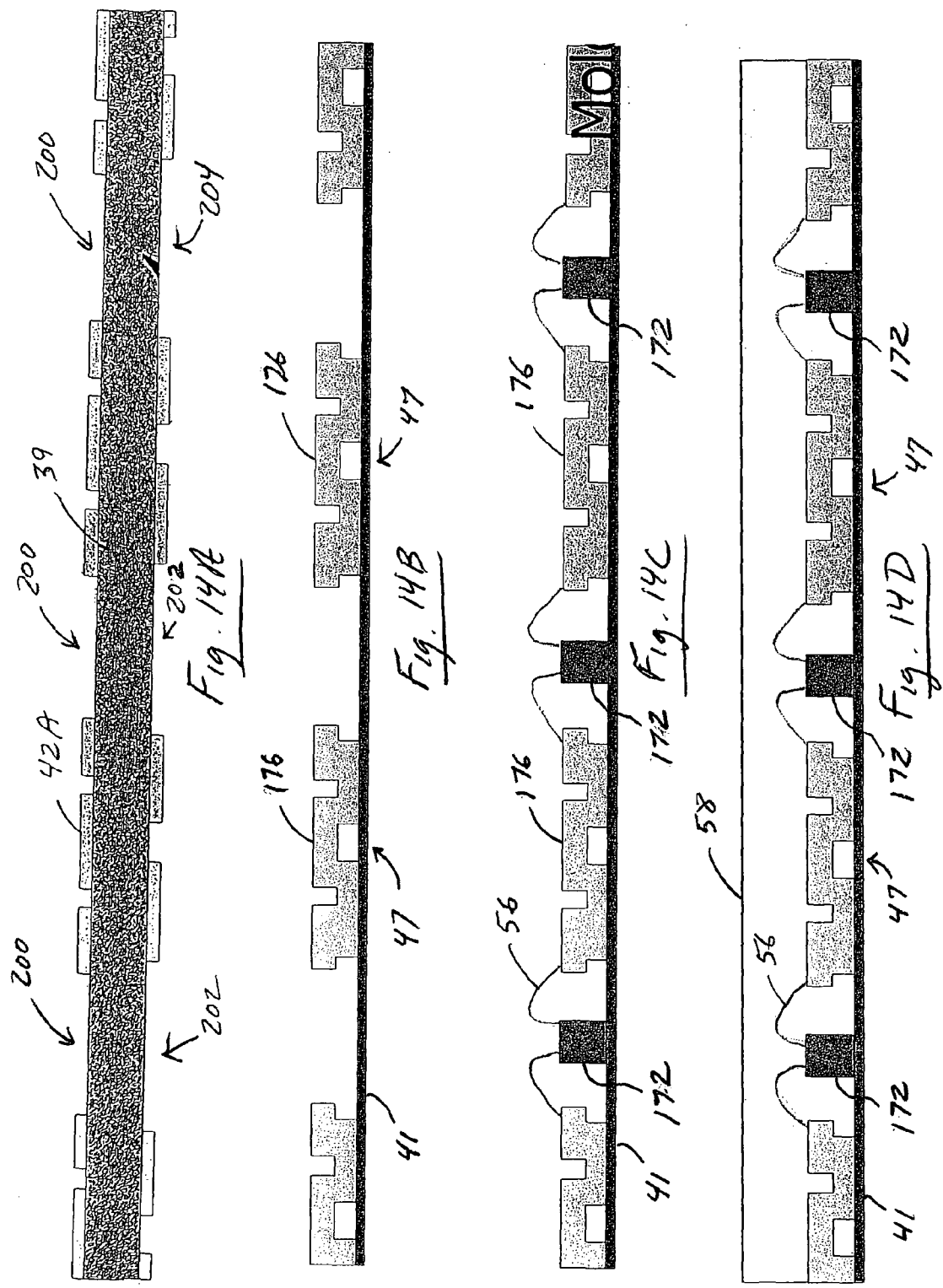

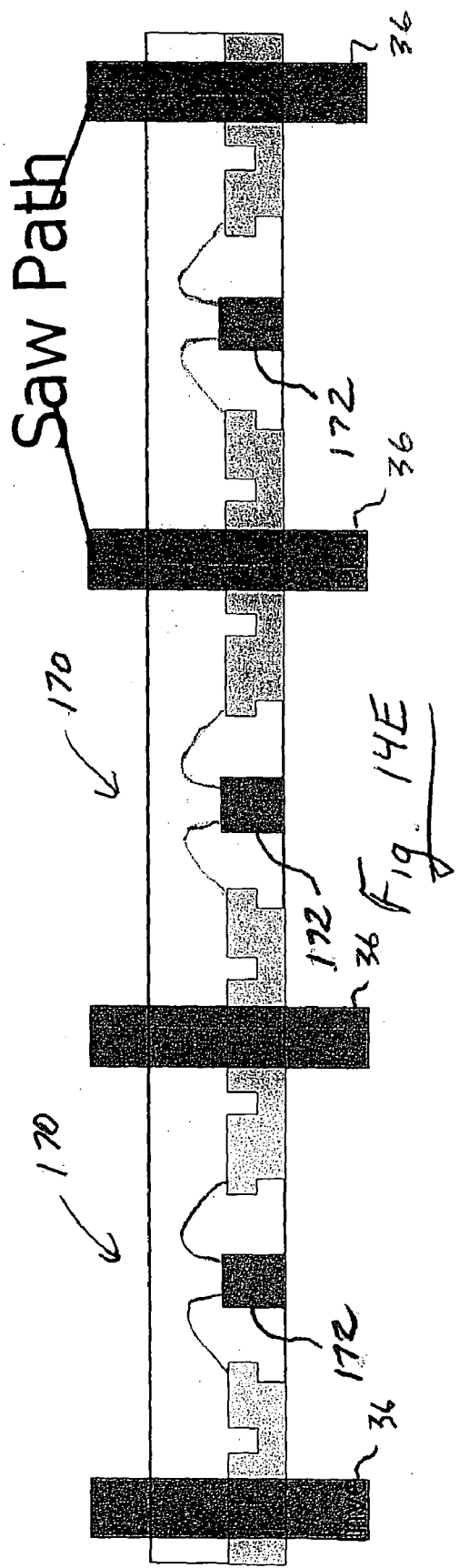

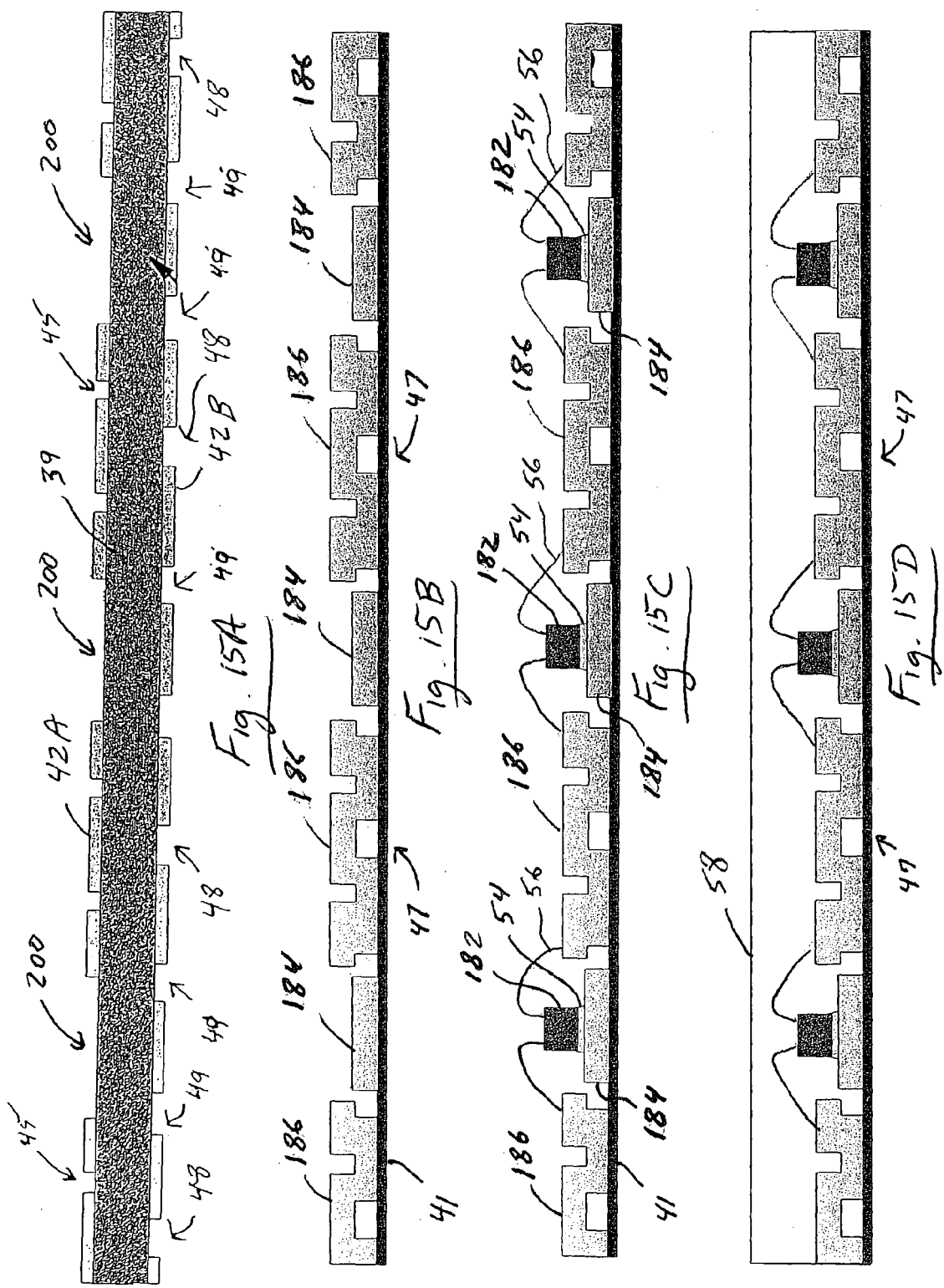

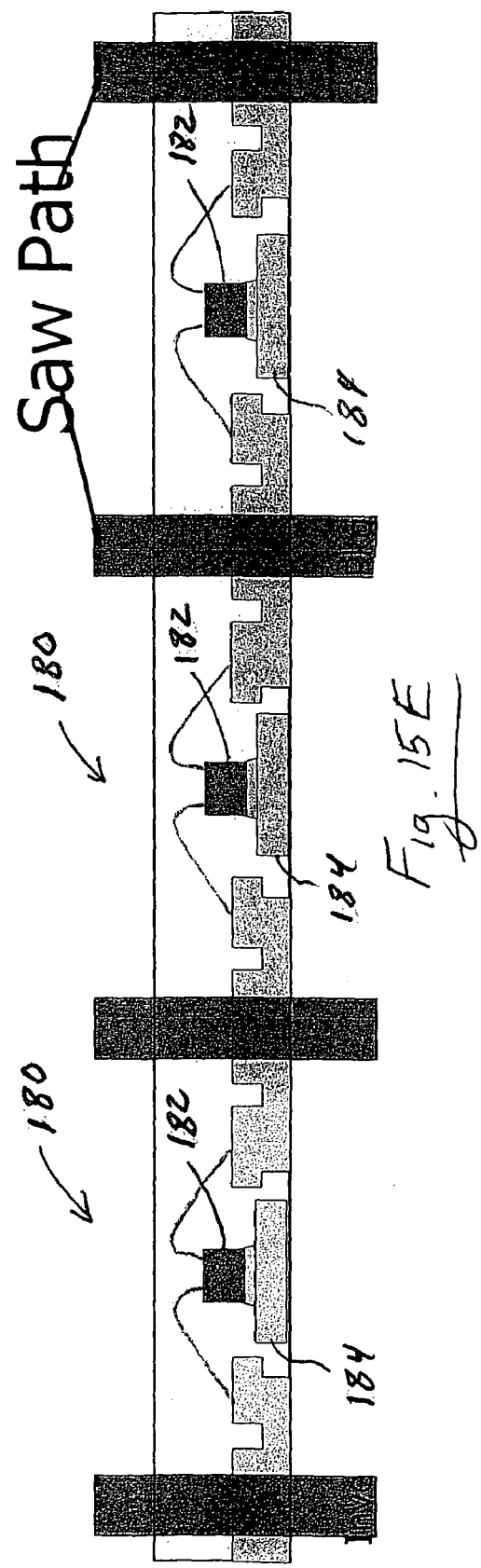

METHOD OF FABRICATING NO-LEAD PACKAGE FOR SEMICONDUCTOR DIE WITH HALF-ETCHED LEADFRAME

FIELD OF THE INVENTION

This invention relates to packages for semiconductor dice and in particular to "no-lead" packages, i.e., packages in which there are no leads protruding from the surfaces of the package. Instead, electrical contact to external circuitry is made by means of contacts having exposed faces that are flush with the surfaces of the package.

BACKGROUND OF THE INVENTION

Semiconductor dice are normally packaged in a plastic capsule to protect them from physical damage. Connections are made to external circuitry, such as a printed circuit board (PCB), by means of metal pieces, called "lead fingers," that protrude from the capsule and can be soldered or otherwise connected electrically. Alternatively, in a "no lead" package the metal pieces have faces that are flush with the surfaces of the capsule. Two types of "no-lead" packages are designated in the industry as QFN (Quad Flat No Lead) and DFN (Dual Flat No Lead).

A cross-sectional view of a typical "no-lead" package 10 is illustrated in FIG. 1. Package 10 contains a semiconductor die 12, a die-attach pad 14, bonding wires 16 and contacts 18, through which die 12 may be contacted electrically. Die 12 is bonded to die-attach pad 14 with an adhesive layer 20, which may be epoxy. These components are encased in a capsule 22 which is made of a plastic molding compound. Package 10 may be mounted on a printed circuit board (PCB), with the bottom surfaces of contacts 18 soldered, for example, to metal pads or traces on the PCB.

"No-lead" packages are normally manufactured by attaching a plurality of dice to corresponding die-attach pads in a leadframe. The dice and die-attach pads are then encased in a plastic molding compound, and the dice are separated by sawing to produce individual packages each containing a single die. During the sawing process, the contacts tend to separate from the plastic molding compound as a result of the torque load that is imposed by the saw blade. Also, the friction from the saw produces heat, and the differing thermal expansion coefficients of the metal contacts and the molding compound, respectively, likewise tend to cause the molding compound to separate from the contacts. Separation between the molding compound and the contacts creates paths for moisture to enter the package. This moisture may corrode the metal bonds in the package and as the temperature of the package changes cause the bonds to crack and the package to fail.

It would therefore be desirable to find a way to prevent separation between the metal contacts and molding compound during the sawing that is necessary to singulate the packages.

SUMMARY OF THE INVENTION

In accordance with this invention, a longitudinal groove is formed in a leadframe at a location where a saw cut will later be made to separate or "singulate" the packages. The groove is formed by etching the leadframe, typically a copper alloy, partially through its thickness. Typically, the leadframe is etched about half way through to form the groove.

There are many variations of the process. The groove may be wider or narrower than the kerf of the saw cut. The groove may be formed on the side of the leadframe facing the entry of the saw or on the opposite side of the leadframe. During the same process in which the groove is formed, secondary grooves may be formed to help anchor the leadframe in the plastic capsule.

The grooves reduce the torque that is imposed by the saw blade on the structure, and they also reduce the amount of heat that is generated during the sawing process. As explained above, this tends to reduce or eliminate separation between the metal contacts and the plastic molding compound. The secondary grooves also separate the force generated by the cutting action of the saw blade from the bonding wires and areas, thereby preventing cracks in the bonds and bonding wires. The grooves also reduce the size of metal burrs and chips in the molding compound that are created by the sawing process. They also increase the throughput of the process and reduce the wear and tear on the saw blade.

BRIEF DESCRIPTION OF THE DRAWINGS

FIGS. 4A–4D illustrate the steps of a process of fabricating leadframes in accordance with the invention.

FIGS. 4E–4H illustrate the steps of a processes of fabricating semiconductor die packages from the leadframes manufactured in FIGS. 4A–4D.

FIG. 5 is a cross-sectional view of two packages after separation by sawing.

FIGS. 6 and 7 show alternative sizes and configurations of grooves within the scope of the invention.

FIGS. 9–12 are cross-sectional views of several different types of packages that can be fabricating using the technique of this invention.

FIGS. 13A–13E illustrate the steps of fabricating a package of the kind shown in FIG. 10.

FIGS. 14A–14E illustrate the steps of fabricating a package of the kind shown in FIG. 11.

FIGS. 15A–15E illustrate the steps of fabricating a package of the kind shown in FIG. 12.

DESCRIPTION OF THE INVENTION

Figure 1:
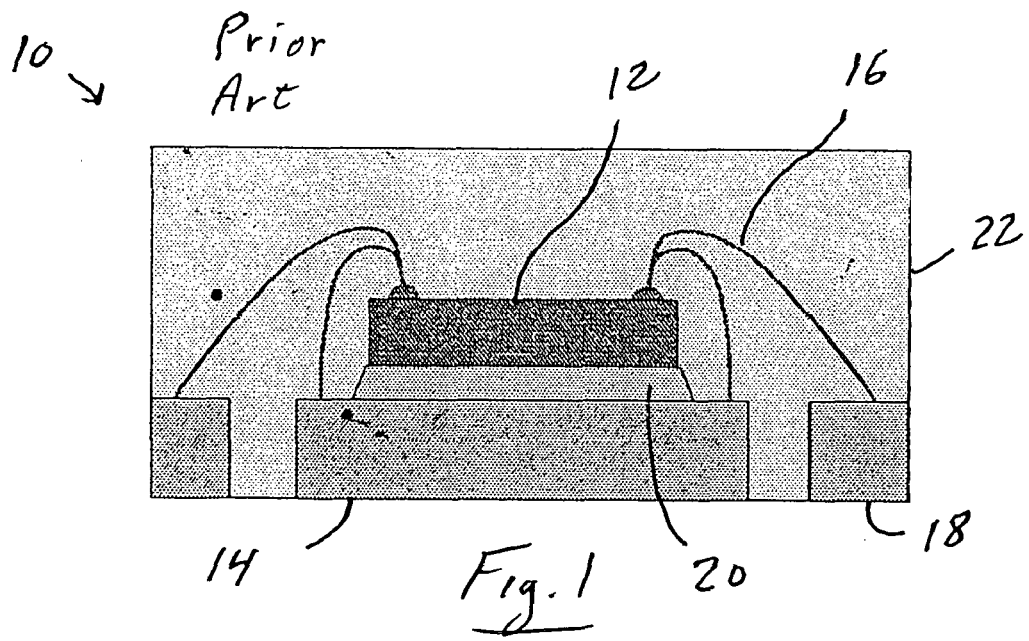
FIG. 1 is a cross-sectional view of a typical no-lead semiconductor package.
Figure 2:
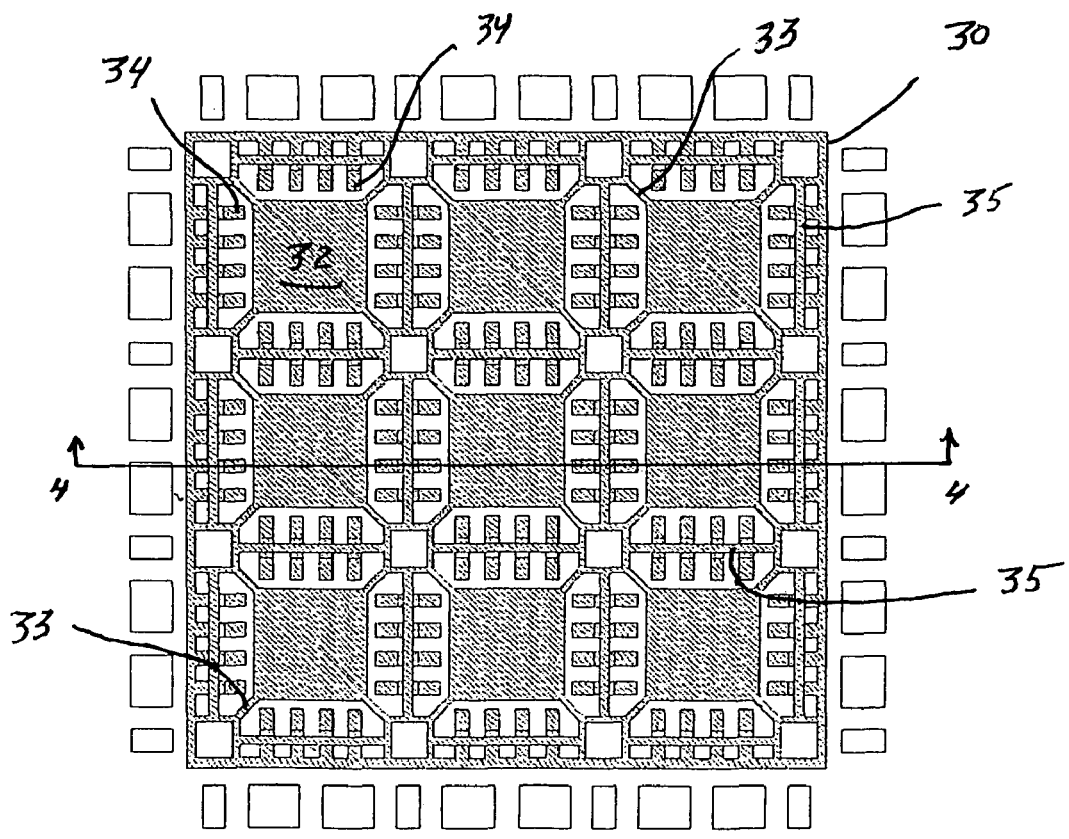
FIG. 2 is a top view of a matrix array of leadframes joined together by tie bars.

FIG. 2 shows a matrix array 30 of leadframes for QFN packages. The leadframes in matrix array 30 have nine die-attach pads 32, arranged 3×3, on which semiconductor dice are to be mounted. Each die-attach pad 32 is surrounded by 16 metal contacts 34, four on each side. It will be understood that the leadframe could have more or less than nine die-attach pads and each die-attach pad could be surrounded by more or less than 16 metal contacts. Die-attach pads 32 and contacts 34 are held together by tie bars 33 and 35. Tie bars 33 connect to the corners of die-attach pads 32, and tie bars 35, which are arranged in an orthogonal pattern, connect the contacts 34 together. Tie bars 35 will be severed later when the packages are separated. The open boxes around the periphery of matrix array 30 are "heat slots" used to compensate for the expansion of the copper alloy during the wire bonding and molding processes.

Figure 3:
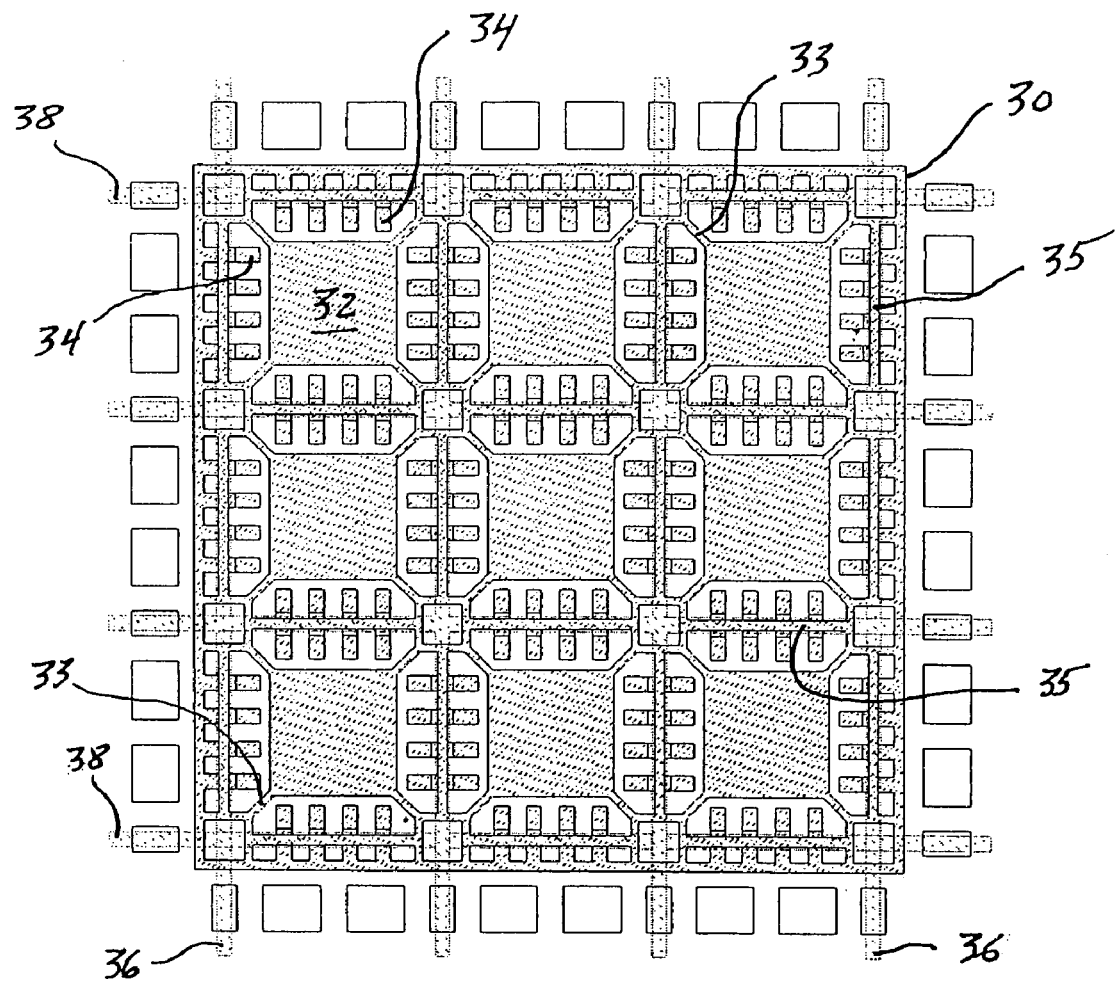
FIG. 3 is a view similar to FIG. 2 showing in addition the locations of saw cuts that will be made to separate the packages.

FIG. 3 is a view similar to FIG. 2 showing orthogonal saw cuts 36 and 38 that could be made to separate the die-attach pads 32 and the dice mounted on them into separate packages. As indicated, saw cuts 36, 38 generally coincide with the locations of the orthogonal tie bars 35 that connect the metal contacts 34.

According to this invention, leadframe 30 is half-etched along the saw cuts 36 and 38 to reduce the amount of heat generated and the strength of the torque load produced by the sawing process. This also improves the quality and precision of the saw cuts.

FIGS. 4A–4H illustrate the steps of a process that can be used to manufacture packages in accordance with this invention. In particular, FIGS. 4A–4D illustrate a proces for fabricating leadframes in accordance with the invention. FIGS. 4E–4H illustrate a process of fabricating packages from the leadframes. These two processes may be performed by separate firms, a leadframe manufacturer and a package manufacturer.

Figure 4D:
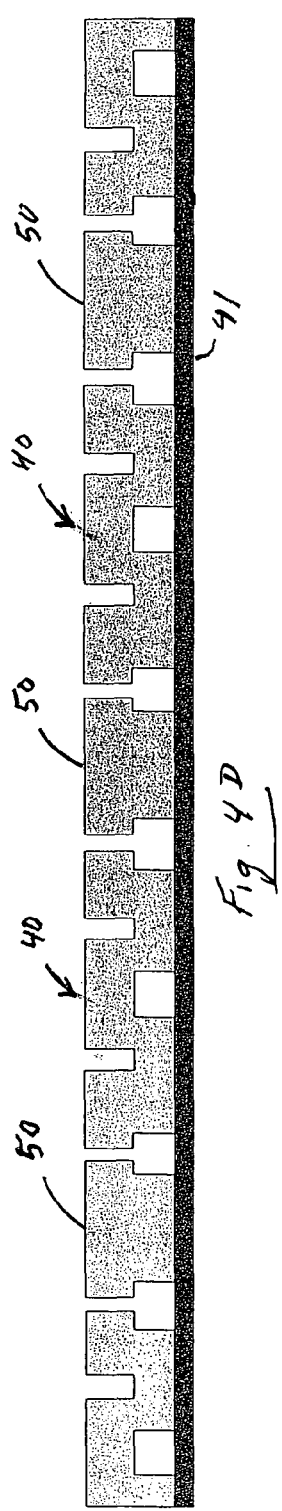

FIG. 4A is a cross-sectional view of a metal sheet 39. Metal sheet 39 could be made of a copper alloy well known in the industry and could be 0.127 to 0.254 mm thick, for example. The copper alloy could be C194 (97.5% Cu/2.35% Fe/0.03% P/0.12% Zn), C7025 (96.2% Cu/3.0% Ni/0.65% Si/0.15% Mg), or Eftec 64T (99.25% Cu/0.25% Sn/0.3Cr/0.2Zn). A photoresist mask layer 42A is deposited on the top face of sheet 39, and similarly a photoresist mask layer 42B is deposited on the bottom face of sheet 39. Mask layers 42A and 42B could be 10–30 microns thick, for example. Mask layers 42A and 42B are then patterned by conventional photolithographic processing to form a series of longitudinal openings. Some of the openings (designated 45) in mask layer 42A define areas where locking features will be formed in the leadframes, and other openings (designated 46) define where the die-attach pads will be separated from metal contacts. Some of the openings (designated 48) in mask layer 42B are located where the saw cuts will be made, and other openings (designated 49) are located directly below openings 46 in mask layer 42A. FIGS. 4A–4H are taken at a cross-section similar to section line 4—4 in FIG. 2. Thus it will be understood that photoresist layers 42A and 42B are patterned so as to create a network of die-attach pads, contacts and tie bars similar to those shown in FIG. 2.

As is apparent from FIG. 4A, each of openings 46 is vertically aligned with one of openings 49. Moreover, the vertical projection of each opening 46 lies entirely within one of the openings 49, and both of the edges of each opening 46 are laterally offset with respect to the edges of the one of openings 49 with which it is vertically aligned.

As shown in FIG. 4B, metal sheet 39 is etched through the openings 45, 46, 48, and 49. The etch process is performed such that about one-half (±0.030 mm) of the thickness of metal sheet 39 is etched through each opening. Assuming that metal sheet 39 is made of copper alloy and is 0.203 mm thick, this could be done be etching in cupric chloride at 550±10° C. for about 20 seconds. Cupric chloride is available from many suppliers, including ATOTECH, Meltex, Shipley Ronal, Electrochemical, Technic and MacDermid. The result of this process is to form a plurality of leadframes 40, as shown in FIG. 4B. In particular, the metal sheet 39 is etched all the way through where openings 46 and 49 are located, locking features 53 are formed where openings 45 are located, and grooves 47 are formed under openings 46, where the saw cuts will be made.

Although in this embodiment metal sheet 39 is shown as etched about halfway through, in practice the degree of etching is determined for each individual situation. If not enough metal is etched, sawing will be more difficult. If too much metal is etched from the metal sheet, it will become too flexible and will not hold together well.

Photoresist layers 42A and 42B are then removed, yielding the structure shown in FIG. 4C, which includes die-attach pads 50 and contacts 51. It will be understood that although die attach pads 50 and contacts 51 appear to be separated in FIG. 4C, they are actually attached by means of tie bars similar to tie bars 33 shown in FIG. 2 in the third dimension outside of the plane of FIG. 4C.

Next, as shown in FIG. 4D, a layer of adhesive tape 41 is attached to the bottom of leadframes 40. The tape can be a polyimide base film with an adhesive layer that includes silicon or epoxy glue, e.g., the TRM6250 series from Nitto or the SP513 series from Kolon.

Figure 4E:
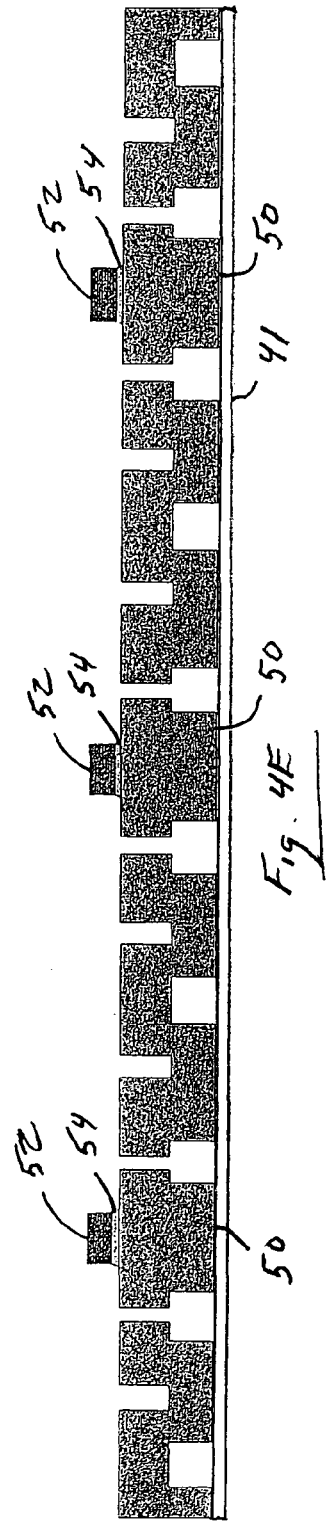

As shown in FIG. 4E, semiconductor dice 52 are bonded to die-attach pads 50, using a layer 54 of epoxy.

Figure 4F:
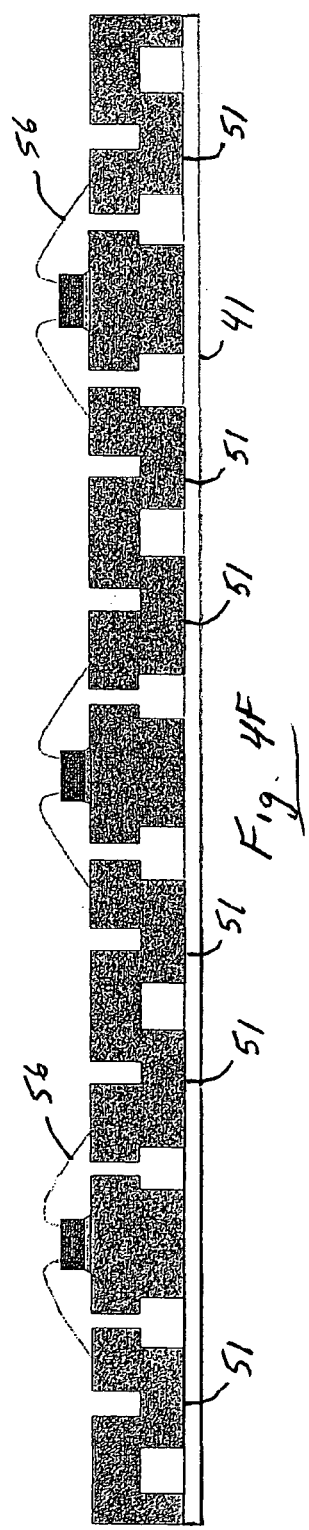

Next, as shown in FIG. 4F, using a wire-bonding machine, metal contact pads (not shown) on the top surface of dice 52 are wire-bonded to selected contacts 51 with bonding wires 56. As shown in FIG. 4G, the dice 52, die-attach pads 50, bonding wires 56 and contacts 51 are encapsulated in a layer 58 of plastic molding compound, with the bottom surfaces of die-attach pads 50 and contacts 51 being flush with the bottom of layer 58. Dice 52 and bonding wires 56 are completely encased in layer 58. Layer 58 may be made of various epoxy molding compounds such as the Sumitomo G600 series, G770 series, EME 7730 series or the Hitachi CEL 9200 series, CEL 9220 series, etc.

Finally, as shown in FIG. 4H, tape 41 is removed, and a series of parallel saw cuts 36 are made in the locations of openings 47 (shown in FIG. 4G) to separate the packages in the X direction. Similarly, a series of perpendicular saw cuts 38 are made to separate the packages in the Y direction. In each case, the saw enters from the bottom of the structure as shown in FIG. 4H. As is apparent from FIG. 3, saw cuts 36 and 38 are at the locations of tie bars 35 and typically tie bars 35 are completely eliminated by the saw cuts.

FIG. 5 shows a cross-sectional view of two semiconductor packages 60 that are produced after the saw cuts 36, 38 have been made. Locking features 53 on the contacts 51 help to anchor contacts 51 in the layer 58 of plastic molding compound.

There are a number of alternative structures that are within the scope of the invention. FIG. 6 shows cross-sectional view of leadframes 90, 92, 94, 96, 98, 100 and 102, showing various sizes and positions of grooves in relation to the midpoint of the saw cut. For example, in leadframes 92 and 94 the groove is on the bottom of the leadframe, on the side facing the entry of the saw. In leadframes 90 and 96 the groove is on the top of the leadframe, on the side opposite the entry of the saw. In leadframes 90 and 92 the groove is narrower than the kerf of the saw blade; in leadframes 94 and 96 the groove is wider than the kerf of the saw blade. In leadframes 98, 100 and 102, secondary grooves are formed on the opposite side of the leadframe to help anchor the leadframe in the molding compound.

Leadframes 110, 112, 114, 116, 118, 120 and 122, shown in FIG. 7, are similar to leadframes 90, 92, 94, 96, 998, 100, and 102, respectively, except that additional notches 121 are formed in the leadframe to further help anchor the leadframe in the molding compound.

Figure 8A:
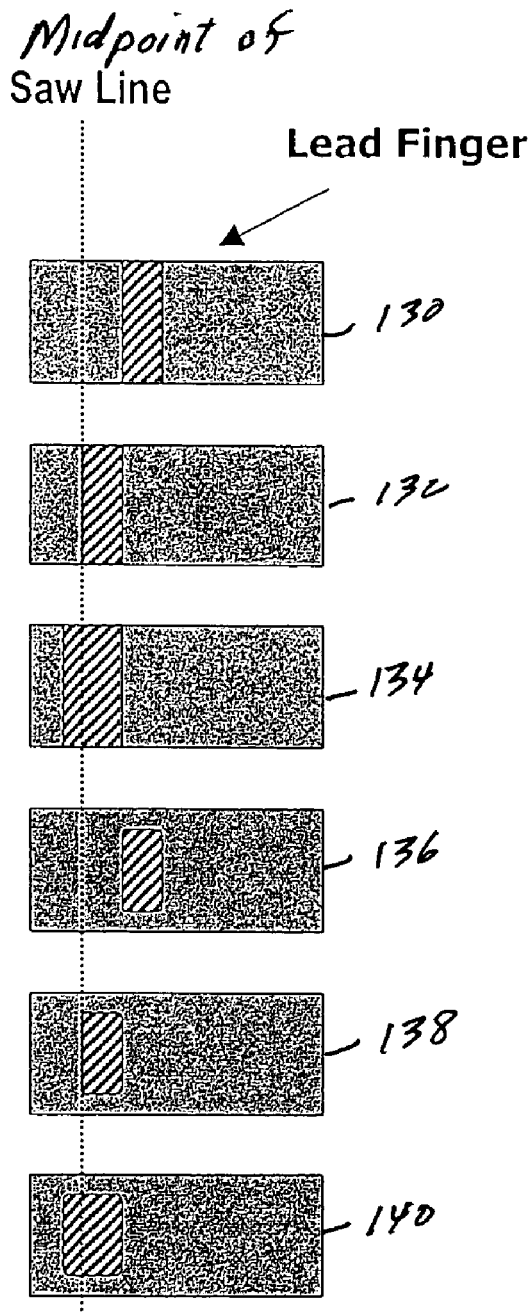
FIG. 8A is a top view of several embodiments, showing variations in the size of the groove and its position in the relation to the saw line.
Figure 8B:
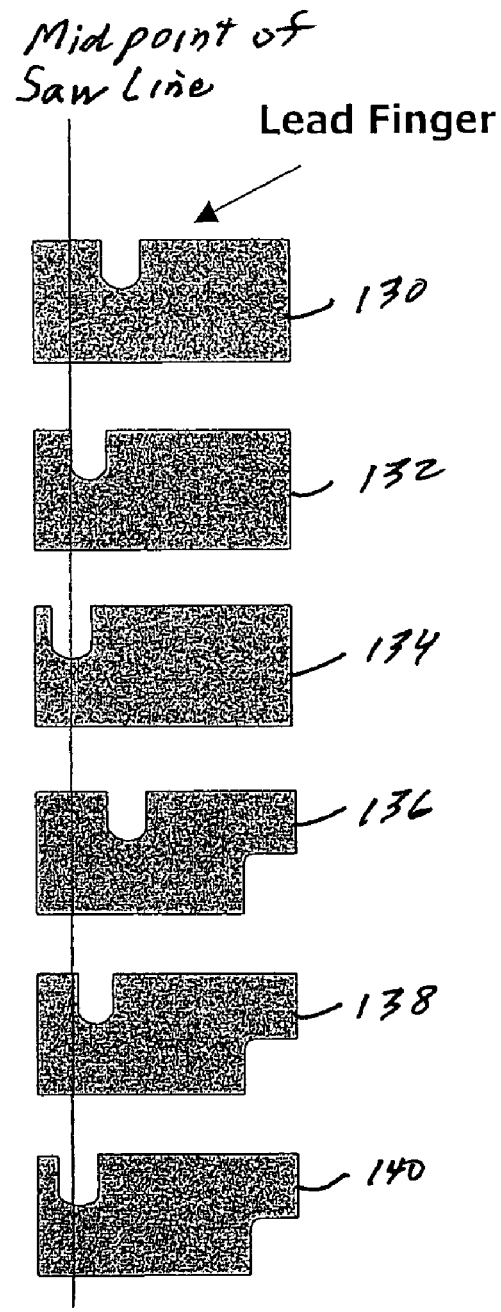
FIG. 8B is a cross-sectional view of the embodiments shown in FIG. 8A.

FIGS. 8A and 8B are top and cross-sectional views, respectively, of several contacts, showing how the size of location of the groove may be varied. In contact 130, the groove is located on one side of the saw cut and forms a locking feature with the molding compound in the finished package. In contact 132, the saw cut coincides with one edge of the groove. In contact 134, the groove is somewhat wider and the saw cut is located near the center of the groove. Contacts 136, 138 and 140 are similar to contacts 132, 134 and 136, respectively, except that the grooves do not extend all the way across the contacts.

FIGS. 9–12 show cross-sectional views of several different types of packages that can be fabricated using the technique of this invention. In each drawing the saw cut is shown as a hatched area separating the contacts of adjacent packages. In packages 150 shown in FIG. 9, the die 152 is mounted atop a die-attach pad (DAP) 154, which is of the same thickness as contacts 156. In packages 160 shown in FIG. 10, the DAP is omitted and the bottom surface of die 162 is covered with a layer of an adhesive such as epoxy. In packages 170 shown in FIG. 11, the DAP is omitted and the bottom surface of the die 172 is exposed on the bottom of the package. Note that die 172 is somewhat thicker than dice 152 and 162. In packages 180 shown in FIG. 12, die 182 is mounted on a DAP 184 that is thinner than the contacts 186.

FIGS. 13A–13E, 14A–14E and 15A–15E illustrate several steps in processes that could be used to manufacture the packages shown in FIGS. 10, 11 and 12, respectively.

FIG. 13A shows metal sheet 39, preferably made of copper alloy, with photoresist mask layer 42A deposited on the top face of sheet 39 and photoresist mask layer 42B deposited on the bottom face of sheet 39. Openings 200 are formed in mask layer 42A and openings 202 are formed in mask layer 42B. Metal sheet 39 is then etched through mask layers 42A and 42B. The result, shown in FIG. 13B, is a structure that includes contacts 166 but no die attach pads. While contacts 166 appear in FIG. 13B to be "floating," it will be understood that contacts 166 are connected together by tie bars in the third dimension outside the plane of the drawing. Each pair of contacts 166 contains a groove 47 where the structure will be sawed. After the etching, adhesive tape 41 is adhered to the bottom surface of metal sheet 39.

Next, as shown in FIG. 13C, "dots" of epoxy 164 are placed on the adhesive tape 41, and dice 162 are placed on top of the epoxy dots 164. Terminals (not shown) on the top of dice 162 are bonded with bonding wires 56 to contacts 166, and the structure of dice 162, epoxy dots 164, bonding wires 56 and contacts 166 is encapsulated in a layer 58 of plastic molding compound. The result is shown in FIG. 13D.

Finally, as shown in FIG. 13E, tape 41 is removed, and a series of parallel saw cuts 36 are made at the locations of openings 47 (shown in FIG. 13D) to separate the packages in the X direction. Similarly, a series of perpendicular saw cuts 38 are made to separate the packages in the Y direction. In each case, the saw enters from the bottom of the structure as shown in FIG. 13D. As is apparent from FIG. 3, saw cuts 36 and 38 are at the locations of tie bars 35 and typically tie bars 35 are completely eliminated by the saw cuts.

In the resulting packages 160, shown in FIG. 13E, dice 162 are completely encased in the layer 58 of plastic molding compound while the bottom surfaces of epoxy dots 164 are exposed on the bottom of the packages 204.

Again, FIG. 14A shows metal sheet 39 with a photoresist mask layer 42A deposited on the top face of sheet 39 and a photoresist mask layer 42B deposited on the bottom face of sheet 39. Openings 200 are formed in mask layer 42A and openings 202 are formed in mask layer 42B. Metal sheet 39 is then etched through mask layers 42A and 42B. The result, shown in FIG. 14B (which is identical to FIG. 13B), is a structure that includes contacts 176 but no die attach pads. Each pair of contacts 176 contains a groove 47 where the structure will be sawed. After the etching, adhesive tape 41 is adhered to the bottom surface of metal sheet 39.

Next, as shown in FIG. 14C, dice 172 are placed on the adhesive tape 41. Dice 172 are shown as being somewhat thicker than dice 162 shown in FIG. 13C, but this is not necessarily the case. Terminals (not shown) on the top of dice 172 are bonded with bonding wires 56 to contacts 176, and the structure of dice 172, bonding wires 56 and contacts 176 is encapsulated in a layer 58 of plastic molding compound. The result is shown in FIG. 14D.

Finally, as shown in FIG. 14E, tape 41 is removed, and a series of parallel saw cuts 36 are made at the locations of openings 47 (shown in FIG. 14D) to separate the packages in the X direction. Similarly, a series of perpendicular saw cuts 38 are made to separate the packages in the Y direction. In each case, the saw enters from the bottom of the structure as shown in FIG. 14D. As is apparent from FIG. 3, saw cuts 36 and 38 are at the locations of tie bars 35 and typically tie bars 35 are completely eliminated by the saw cuts.

In the resulting packages 170, shown in FIG. 14E, the bottom surfaces of dice 172 are exposed on the bottom of the packages 170.

FIG. 15A shows metal sheet 39 with a photoresist mask layer 42A deposited on the top face of sheet 39 and a photoresist mask layer 42B deposited on the bottom face of sheet 39. Openings 200 are formed in mask layer 42A while mask layer 42B is patterned similarly to mask layer 42B in FIG. 4A. As is evident from FIG. 15A, the vertical projection of each opening 200 lies entirely within a lateral area defined by two of openings 49 and a portion of mask layer 42B between the two openings 49, and the outside edges of the two openings 49 are laterally offset with respect to the edges of the opening 200. Metal sheet 39 is then etched through mask layers 42A and 42B. The result, shown in FIG. 15B, is a structure that includes contacts 186 and die attach pads 184. Because metal sheet 39 is etched through openings 200, die attach pads 184 are approximately one-half the thickness of die attach pads 50 in FIG. 4C. Each pair of contacts 186 contains a groove 47 where the structure will be sawed. After the etching, adhesive tape 41 is adhered to the bottom surface of metal sheet 39.

Next, as shown in FIG. 15C, dice 182 are attached to die attach pads 184 with epoxy layers 54. Terminals (not shown) on the top of dice 182 are bonded with bonding wires 56 to contacts 186, and the structure of dice 182, epoxy layers 54, bonding wires 56, die-attach pads 184 and contacts 186 is encapsulated in a layer 58 of plastic molding compound. The result is shown in FIG. 15D.

Finally, as shown in FIG. 15E, tape 41 is removed, and a series of parallel saw cuts 36 are made at the locations of openings 47 (shown in FIG. 14D) to separate the packages 180 in the X direction. Similarly, a series of perpendicular saw cuts 38 are made to separate the packages 180 in the Y direction. In each case, the saw enters from the bottom of the structure as shown in FIG. 15D. As is apparent from FIG. 3, saw cuts 36 and 38 are at the locations of tie bars 35 and typically tie bars 35 are completely eliminated by the saw cuts.

The resulting packages 180, including thin die attach pads 184, are shown in FIG. 15E.

While specific embodiments of this invention have been described, these embodiments are illustrative and not limiting. Many alternative embodiments within the broad scope of this invention will be apparent to those of skill in the art.

We claim:

1. A process of fabricating semiconductor packages comprising:
   providing a metal sheet;
   forming a first mask layer on a first surface of the metal sheet;
   patterning the first mask layer to form a plurality of first openings and a plurality of second openings;
   forming a second mask layer on a second surface of the metal sheet;
   patterning the second mask layer to form a plurality of third openings and a plurality of fourth openings, wherein each of the second openings is vertically aligned with one of the fourth openings, a vertical projection of each second opening lying entirely within one of the fourth openings, the edges of said each second opening being laterally offset with respect to the edges of said one of said fourth openings;
   etching the metal sheet through the first, second, third and fourth openings simultaneously to form a plurality of locking grooves aligned with the first openings, a plurality of first separation grooves aligned with the second openings, a plurality of singulation grooves aligned with the third openings, and a plurality of second separation grooves aligned with the fourth openings, the first separation grooves being aligned with the second separation grooves such that during the etching the first and second separation grooves merge and thereby form a plurality of die pads and a plurality of contact elements, the locking grooves being located in the contact elements;
   removing remaining portions of the first and second mask layers;
   attaching a semiconductor die to each of the die pads;
   forming a layer of molding compound on the dice and the metal sheet, the molding compound flowing into the locking grooves and the singulation grooves; and
   sawing the metal sheet and the molding compound so as to form a plurality of semiconductor packages, the sawing comprising making a series of saw cuts, each of the saw cuts being made at a location such that a kerf of the saw cut extends into at least a portion of one or more of the singulation grooves, the saw cuts separating each of the contact elements into a pair of contacts.

2. The process of claim 1 comprising attaching a layer of adhesive tape to the second surface of the metal sheet following the removal of the second mask layer and prior to the attachment of the semiconductor die to each of the die pads.

3. The process of claim 2 comprising removing the layer of adhesive tape before separating the metal sheet and the molding compounds into a plurality of semiconductor packages by making a series of saw cuts.

4. The process of claim 1 wherein the locking grooves are laterally separated from the saw cuts.

5. The process of claim 1 wherein each singulation groove extends across an entire dimension of a contact element in which the singulation groove is formed in a direction parallel to the saw cut.

6. The process of claim 1 wherein a width of the second separation grooves is greater than a width of the first separation grooves so as to form notches in the contact elements, the notches helping to anchor the contacts in the molding compound.

7. The process of claim 1 fabricating semiconductor packages comprising:
   providing a metal sheet;
   forming a first mask layer on a first surface of the metal sheet;
   patterning the first mask layer to form a plurality of first openings and a plurality of second openings;
   forming a second mask layer on a second surface of the metal sheet;
   patterning the second mask layer to form a plurality of third openings and a plurality of fourth openings;
   etching the metal sheet through the first, second, third and fourth openings simultaneously to form a plurality of locking grooves aligned with the first openings, a plurality of first separation grooves aligned with the second openings, a plurality of singulation grooves aligned with the third openings, and a plurality of second separation grooves aligned with the fourth openings, the first separation grooves being aligned with the second separation grooves such that during the etching the first and second separation grooves merge and thereby form a plurality of die pads and a plurality of contact elements, the locking grooves being located in the contact elements;
   removing remaining portions of the first and second mask layers;
   attaching a semiconductor die to each of the die pads;
   forming a layer of molding compound on the dice and the metal sheet, the molding compound flowing into the locking grooves and the singulation grooves; and
   sawing the metal sheet and the molding compound so as to form a plurality of semiconductor packages, the sawing comprising making a series of saw cuts, each of the saw cuts being made at a location such that a kerf of the saw cut extends into at least a portion of one or more of the singulation grooves, the saw cuts separating each of the contact elements into a pair of contacts, wherein the kerf of the saw cuts extends into the locking grooves.

8. A process of fabricating semiconductor packages comprising:
   providing a metal sheet;
   forming a first mask layer on a first surface of the metal sheet;
   patterning the first mask layer to form a plurality of first openings and a plurality of second openings;
   forming a second mask layer on a second surface of the metal sheet;
   patterning the second mask layer to form a plurality of third openings and a plurality of fourth openings;
   etching the metal sheet through the first, second, third and fourth openings simultaneously to form a plurality of locking grooves aligned with the first openings, a plurality of first separation grooves aligned with the second openings, a plurality of singulation grooves aligned with the third openings, and a plurality of second separation grooves aligned with the fourth openings, the first separation grooves being aligned with the second separation grooves such that during the etchinq the first and second separation grooves merge and thereby form a plurality of die pads and a plurality of contact elements, the locking grooves being located in the contact elements;
   removing remaining portions of the first and second mask layers;
   attaching a semiconductor die to each of the die pads;
   forming a layer of molding compound on the dice and the metal sheet, the molding compound flowing into the locking grooves and the singulation grooves; and sawing the metal sheet and the molding compound so as to form a plurality of semiconductor packages, the sawing comprising making a series of saw cuts, each of the saw cuts being made at a location such that a kerf of the saw cut extends into at least a portion of one or more of the singulation grooves, the saw cuts separating each of the contact elements into a pair of contacts, wherein each singulation groove does not extend across the entire dimension of a contact element in which the singulation groove is formed in a direction parallel to the saw cut.

9. A process of fabricating semiconductor packages comprising:

providing a metal sheet;

forming a first mask layer on a first surface of the metal sheet;

patterning the first mask layer to form a plurality of first openings and a plurality of second openings;

forming a second mask layer on a second surface of the metal sheet;

patterning the second mask layer to form a plurality of third openings and a plurality of fourth openings, wherein the vertical projection of each of the second openings lies entirely within a lateral area defined by two of the fourth openings and a portion of the second mask layer between the two fourth openings, and the outside edges of the two fourth openings are laterally offset with respect to the edges of the second opening;

etching the metal sheet through the first, second, third and fourth openings simultaneously to form a plurality of locking grooves aligned with the first openings, a plurality of pad grooves aligned with the second openings, a plurality of singulation grooves aligned with the third openings, and a plurality of separation grooves aligned with the fourth openings, a portion of the separation grooves being aligned with edges of the pad grooves such that during the etching the pad and separation grooves merge and thereby form a plurality of die pads and a plurality of contact elements, the die pads being thinner than the contact elements, the locking grooves being located in the contact elements;

removing remaining portions of the first and second mask layers;

attaching a semiconductor die to each of the die pads;

forming a layer of molding compound on the dice and the metal sheet, the molding compound flowing into the locking grooves and the singulation grooves; and sawing the metal sheet and the molding compound so as to form a plurality of semiconductor packages, the sawing comprising making a series of saw cuts, each of the saw cuts being made at a location such that a kerf of the saw cut extends into at least a portion of one or more of the singulation grooves, the saw cuts separating each of the contact elements into a pair of contacts.

10. The process of claim 9 wherein edges of the separation grooves are offset with respect to edges of the pad grooves so as to form notches in the contact elements, the notches helping to anchor the contacts in the molding compound.

* * * * *